United States Patent
Tokuda et al.

(10) Patent No.: US 7,989,260 B2
(45) Date of Patent: Aug. 2, 2011

(54) METHOD OF SELECTIVELY FORMING ATOMICALLY FLAT PLANE ON DIAMOND SURFACE, DIAMOND SUBSTRATE PRODUCED BY THE METHOD, AND SEMICONDUCTOR DEVICE USING THE SAME

(75) Inventors: Norio Tokuda, Ibaraki (JP); Hitoshi Umezawa, Ibaraki (JP); Satoshi Yamasaki, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 156 days.

(21) Appl. No.: 12/227,163

(22) PCT Filed: Apr. 23, 2007

(86) PCT No.: PCT/JP2007/058754
§ 371 (c)(1),
(2), (4) Date: Jan. 7, 2009

(87) PCT Pub. No.: WO2007/132644
PCT Pub. Date: Nov. 22, 2007

(65) Prior Publication Data
US 2009/0127566 A1 May 21, 2009

(30) Foreign Application Priority Data

May 11, 2006 (JP) .................................. 2006-132145

(51) Int. Cl.
*H01L 21/00* (2006.01)
(52) U.S. Cl. ............. 438/105; 257/77; 117/103; 117/88
(58) Field of Classification Search .................. 438/105; 257/77
See application file for complete search history.

(56) References Cited

U.S. PATENT DOCUMENTS 5,160,405 A * 11/1992 Miyauchi et al. ............... 216/62

OTHER PUBLICATIONS

T. Makino et al., "Strong Excitonic Emission from (001)-Oriented Diamond P-N Junction", Japanese Journal of Applied Physics., vol. 44, No. 38, pp. L1190-L1192, 2005.
H. Watanabe et al., "Homoepitaxial diamond film with an atomically flat surface over a large area", Diamond and Related Materials, vol. 8, pp. 1272-1276, 1999.

* cited by examiner

*Primary Examiner* — Matthew C Landau
*Assistant Examiner* — Sonya D McCall Shepard
(74) *Attorney, Agent, or Firm* — Wenderoth, Lind & Ponack, L.L.P.

(57) ABSTRACT

The present invention provides a method of selectively forming a flat plane on an atomic level on a diamond (001), (110) or (111) surface.
A method of selectively forming a flat plane on a diamond surface comprising growing diamond on a stepped diamond surface of any of crystal structures (001), (110) and (111) by CVD (Chemical Vapor Deposition) under growth conditions such that step-flow growth of diamond is carried out thereafter.

4 Claims, 7 Drawing Sheets

US 7,989,260 B2

METHOD OF SELECTIVELY FORMING ATOMICALLY FLAT PLANE ON DIAMOND SURFACE, DIAMOND SUBSTRATE PRODUCED BY THE METHOD, AND SEMICONDUCTOR DEVICE USING THE SAME

This application is a U.S. national stage of International Application No. PCT/JP2007/058754 filed Apr. 23, 2007.

TECHNICAL FIELD

The present invention relates to epitaxial growth of diamond, and, more particularly, to epitaxial growth of diamond which can improve semiconductor device performance and a method of selectively forming a flat plane on an atomic level on a diamond surface.

BACKGROUND ART

There has been known that a homoepitaxially grown film surface of diamond is likely to have defects, such as abnormally grown particles, macrobunching, and etch pits, formed thereon.

Those defects deteriorate the device performance. With regard to other materials, the planarization of the surface in the device performance is very important, and those defects need to be suppressed in a device to be prepared in device fabrication using diamond.

There is a report on the formation of a step-terrace structure on a diamond (001) substrate at a methane concentration of 0.025% using microwave plasma CVD (see Non-patent Document 1).

However, such a flat surface cannot be obtained on a (111) substrate. The device fabrication using diamond, therefore, needs a technique of selectively forming n flat surface of the device size.

Meanwhile, with regard to other materials, it is known that a mesa surface is formed atomically flat by carrying out chemical vapor deposition ($H_2$ (4400 cm$^3$/min), $SiH_4$ (2.7 cm$^3$/min), $C_3H_8$ (0.3 cm$^3$/min), 1600° C., 20 mbar for 30 minutes) after forming a mesa structure on SiC substrate (see Non-patent Document 2).

It is also known that a mesa surface is formed flat by carrying out deposition at a substrate temperature of 850° C. with a supersonic beam $Si_2H_6$ as a source material after forming a mesa structure on Si (111) substrate (see Non-patent Document 3).

Further, it is known that a mesa surface is made atomically flat by carrying out metalorganic vapor phase epitaxy after forming a mesa structure on a GaAs (111) B substrate using $SiO_2$ mask (see Non-patent Document 4).

Non-patent Document 1: H. Watanabe, D. Takeuchi, S. Yamanaka, H. Okushi, K. Kajimura, T. Sekiguchi, Diamond and Related Materials 8 (1999) 1272-1276.

Non-patent Document 2: J. Anthony Powell, Philip G. Neudeck, Andrew J. Trunek, Glenn M. Beheim, Lawrence G. Matus, Richard W. Hoffman, Jr., and Luann J. Key, Growth of step-free surfaces on device-size (0001) SiC mesas, Applied Physics Letters Vol. 77 (2000) 1449-1451.

Non-patent Document 3: Doohan Lee, Jack M. Blakely, Todd W. Schroeder and J. R. Engstrom, A growth method for creating arrays of atomically flat mesas on silicon, Applied Physics Letters Vol. 18 (2001) 1349-1351.

Non-patent Document 4: Toshio Nishida and Naoki Kobayashi, Step-free surface grown on GaAs (111) B substrate by selective area metalorganic vapor phase epitaxy, Applied Physics Letters Vol. 69 (1996) 2549-2550.

DISCLOSURE OF INVENTION

Problem to be Solved by the Invention

According to the present invention, step-flow growth was employed after forming A mesa structure on the (001), (110) or (111) surface of diamond using the method to attempt selective formation of a flat plane on the mesa surface, it was found that a flat plane could be also selectively formed on the (001), (110) or (111) surface of diamond, and further, selective formation of a complete step-free diamond surface was realized. The present invention provides a method of selectively forming a plane flat on the atomic level on the (001), (110) or (111) surface of diamond.

Means for Solving the Problem

The present invention is a method of selectively forming an atomically flat plane on a diamond surface comprising growing diamond on a stepped diamond surface of any of crystal structures (001), (110) and (111) by CVD (Chemical Vapor Deposition) under growth conditions such that step-flow growth of diamond is carried out thereafter.

According to the present invention, it is desirable that the stepped diamond surface should be acquired by depositing a metal on a surface of a diamond substrate with any one of the crystal structures (001), (110) and (111), processing the metal using a lithography technique, and then etching the diamond using the metal as a mask.

Further, according to the present invention, microwave plasma CVD may be used as CVD.

Furthermore, according to the present invention, a feed amount of a carbon source gas can be controlled such that the feed amount of the carbon source gas is 0.001% to 0.2% in the step-flow growth.

EFFECT OF THE INVENTION

According to the present invention, it was found that an atomically flat plane could be selectively formed on the (001), (110) or (111) surface of diamond, and that a complete step-free diamond surface could be selectively formed.

BEST MODE FOR CARRYING OUT THE INVENTION

A diamond surface to be used in the present invention has a crystal structure (001), (110) or (111), and the present invention can also be implemented even on a surface with a crystal structure (110) though its embodiment is not illustrated.

While a mask to be used in the invention is typically gold, platinum or the like, a metal oxide, such as alumina, or silicon oxide can be used instead.

Lithographies are well-known means in the industry, and a well-known lithography can be employed. The process comprises application of a resist, exposure and development. Typical lithographies include a photolithography using light and an electronic lithography using electrons, at the time of exposure. Any resist can be used in the present invention as long as it is cured by exposure. A typical one is ZEP520A or the like.

Well-known popular diamond etching can be used to etch diamond to be used in the present invention. Typical etching is dry etching using ICP (Inductively Coupled Plasma).

Figure 2:
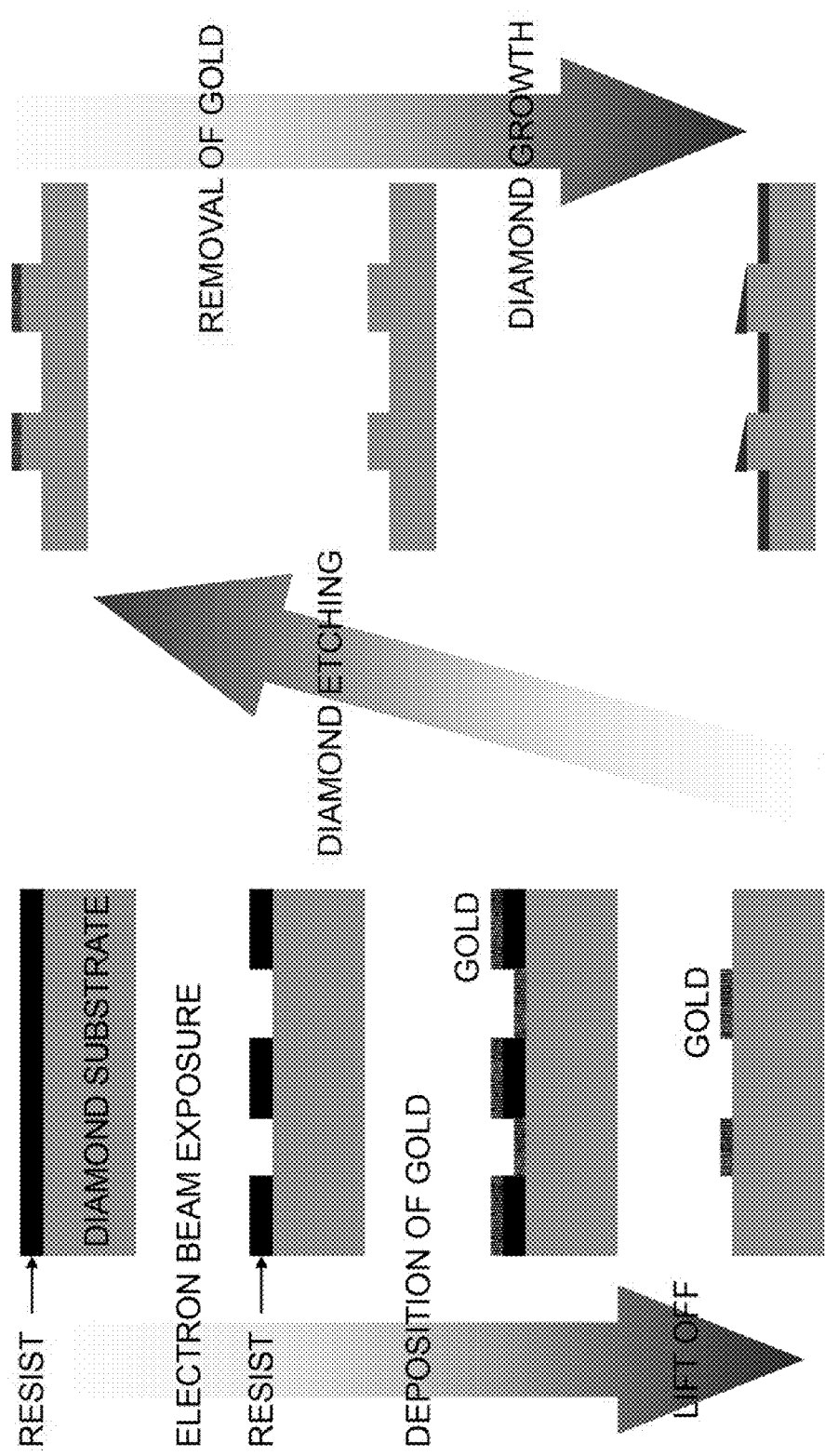
FIG. 2 shows an example of the process of the present invention.

While a typical example of a diamond surface with a step (mesa structure) according to the present invention is obtained through steps as shown in FIG. 2, selective formation of an atomically flat plane according to the invention can be carried out as long as a diamond surface has a step (mesa structure).

Step-flow growth according to the present invention is a method which allows a step to be grown by priority, and needs to control growth conditions, such as the concentration of a carbon source gas, according to the type (001), (110) or (111) of the diamond surface to be used.

As the carbon source gas to be used in the present invention, a mixture of carbon hydride, such as methane or ethane, carbon oxide, carbon dioxide and hydrogen is used. At this time, oxygen or a rare gas may be mixed.

CVD (Chemical Vapor Deposition) can be used as means for the step-flow growth according to the present invention.

Particularly, the use of microwave plasma CVD is desirable.

EXAMPLES

Although the present invention will be described in more details by way of examples, the present invention is not limited to those examples.

Example 1

A description will be given based on a process in FIG. 2.

A resist film was formed on the surface of a diamond substrate (001), desired locations of the resist were removed by electron beam exposure, and then gold was evaporated so that a layer of gold was provided on the diamond substrate (001) surface. Next, lift-off was performed to form a gold layer only at the resist-removed portions. Then, the diamond substrate was processed by diamond etching, and a step (mesa structure) was provided by removing the gold layer, after which diamond was grown under growth conditions (1200 W, 50 Torr, hydrogen concentration of 99.95%, methane concentration of 0.05%) for the step-flow growth of diamond by using microwave plasma CVD.

Figure 1:
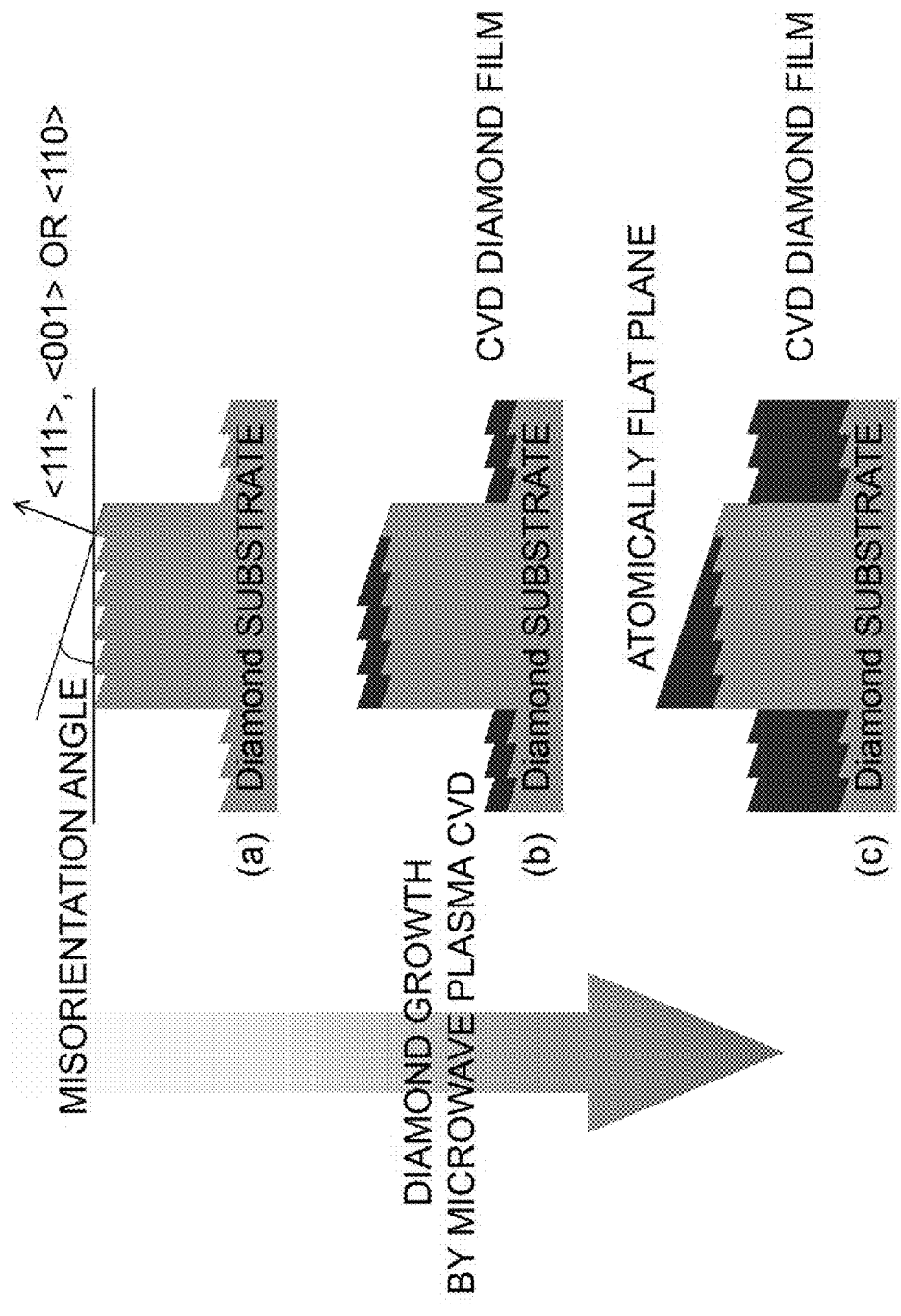
FIG. 1 is an exemplary diagram of the concept (atomically flat plane) of the present invention.

This is illustrated in an exemplary diagram in FIG. 1.

That is, a diamond substrate provided with a step (mesa structure) was prepared, diamond was epitaxially grown by CVD, and it was confirmed that the surface of the step became atomically flat by the epitaxial growth mechanism.

Figure 3:
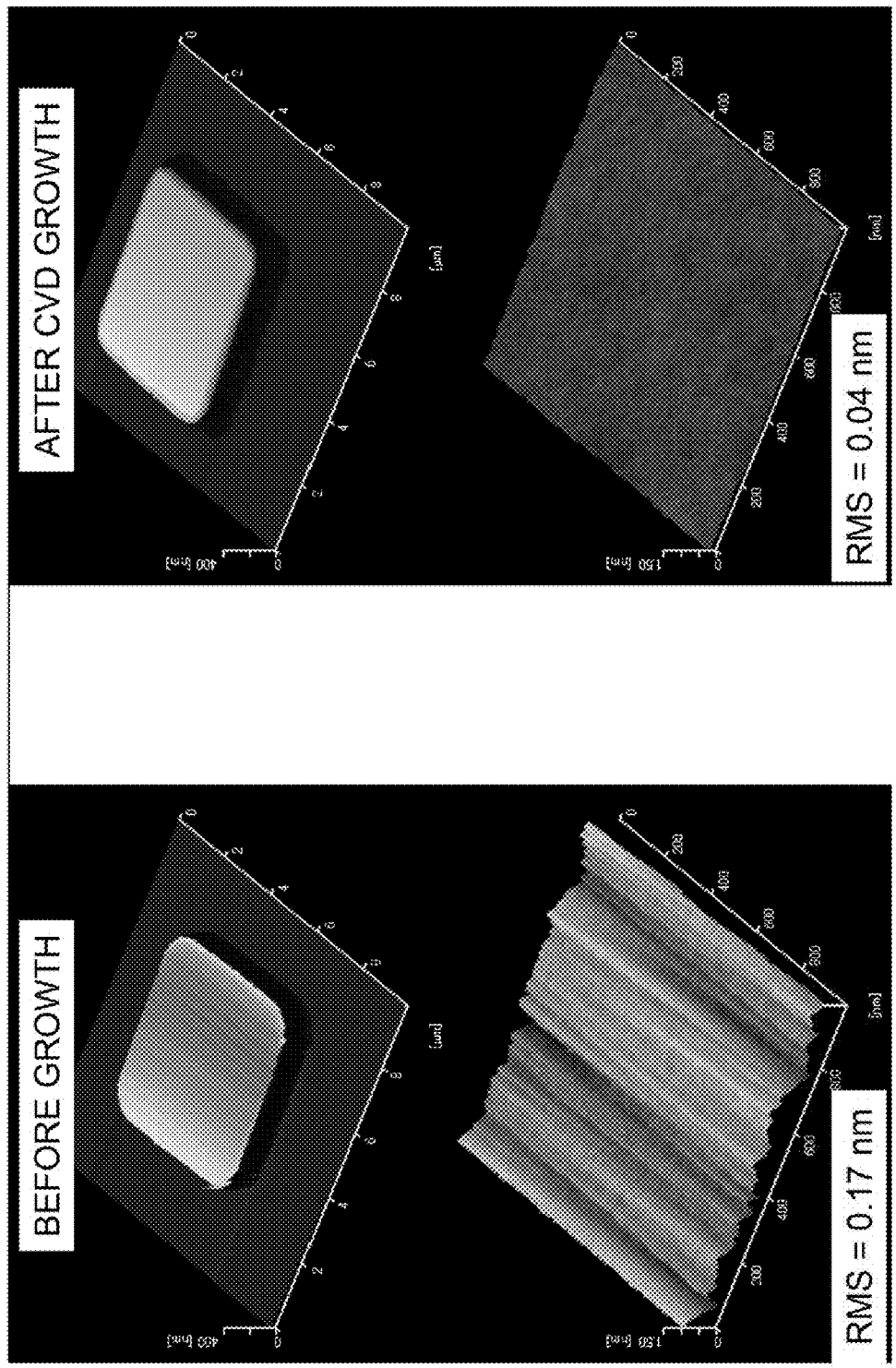
FIG. 3 shows an AFM image of the (001) surface of diamond.

FIG. 3 shows the results.

Example 2

The same manipulation as that of the Example 1 was performed except for the use of a diamond (111) substrate. It is to be noted that the hydrogen concentration was 99.995% and the methane concentration was 0.005%.

Figure 4:
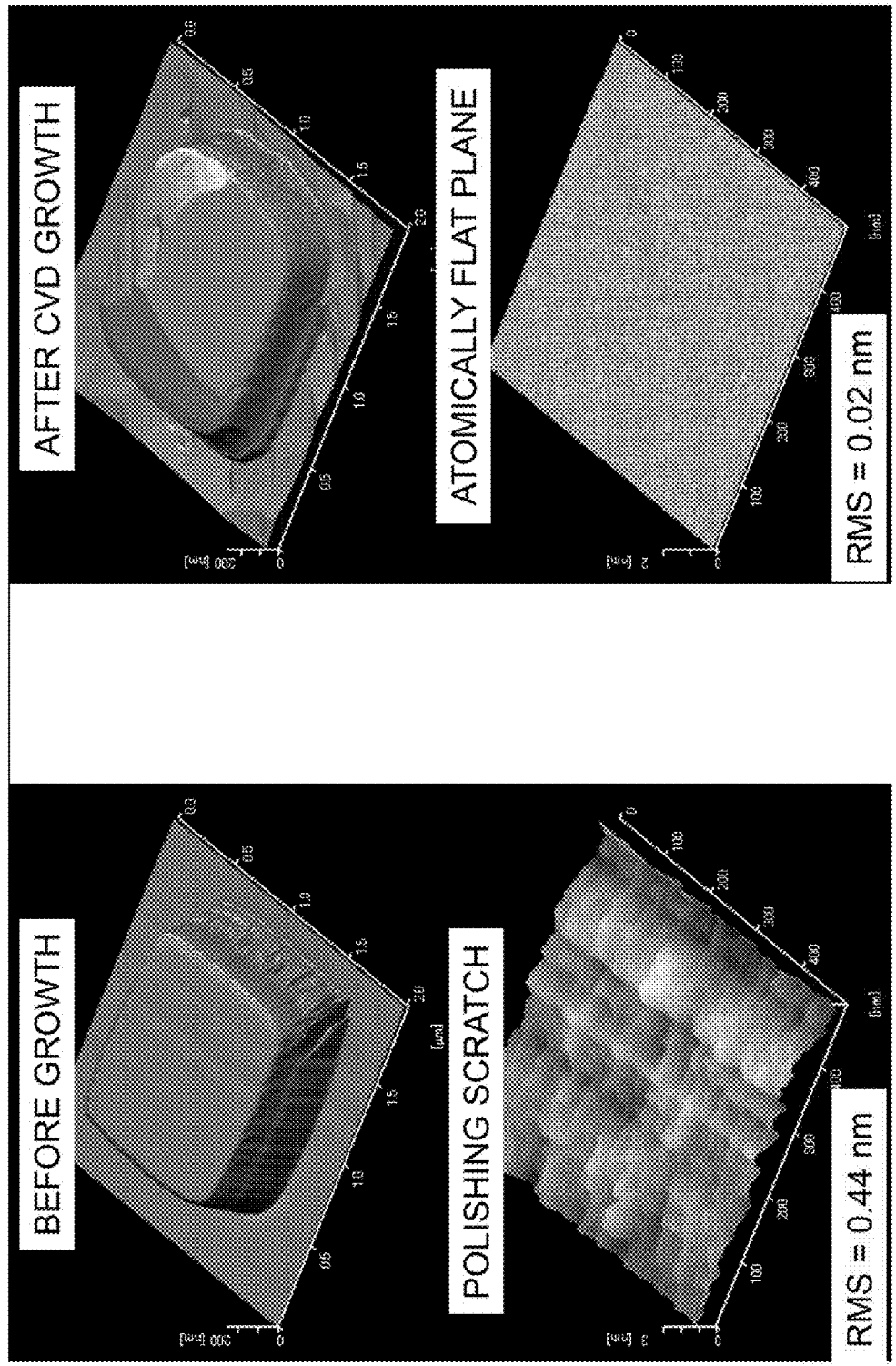
FIG. 4 shows an AFM image of the (111) surface of diamond.
Figure 5:
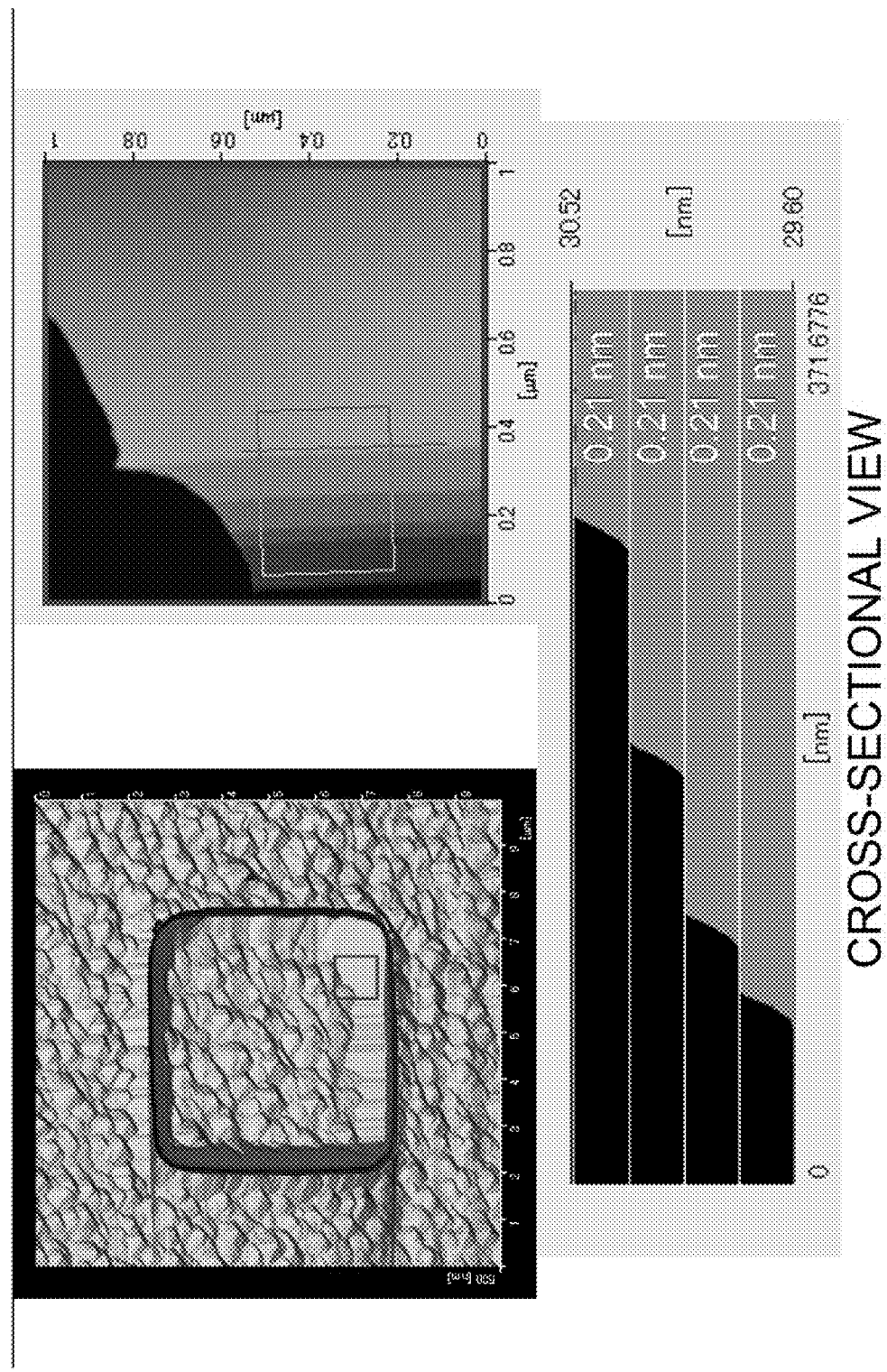
FIG. 5 shows an AFM image of the (111) surface of diamond.

FIGS. 4 and 5 show the results.

A wider surface (FIG. 5) on the mesa has an atomically flat plane and a plane including an atomic step, and a portion having a surface shape similar to that of growth on the substrate. It indicates that the formation of an atomically flat plane is in a midway.

Example 3

Figure 6:
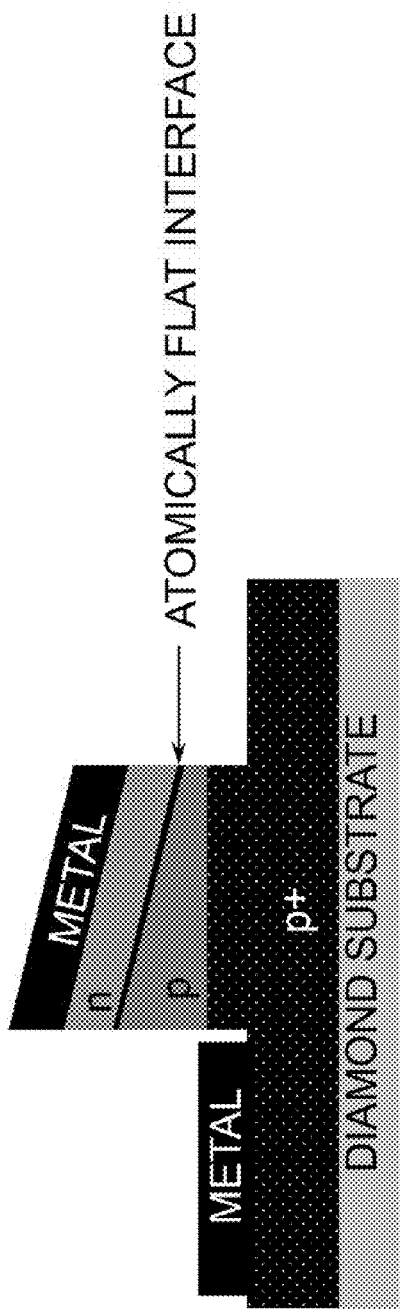
FIG. 6 shows an example of a semiconductor device using a diamond substrate acquired by the method of the present invention.

An Ib diamond (111) substrate obtained by high temperature/high pressure conductivity type composition was introduced into a reactor of a microwave plasma CVD apparatus, and a p$^+$ diamond film having a low resistance was grown. The boron concentration in the film was $10^{20}$ atoms/cm$^3$. Thereafter, the substrate was removed from the reactor and a step (mesa structure) was provided on the surface of the diamond film using a lithography technique. Then, it was placed in the reactor of the microwave plasma CVD apparatus, and a p-type diamond film was grown under growth conditions for step-flow growth of diamond. The boron concentration in the film vas $10^{17}$ atoms/cm$^3$. Thereafter, an n-type diamond film was formed by step-flow growth having nucleation of diamond. The phosphorus concentration in the film was $10^{17}$ atoms/cm$^3$. The pn junction on the mesa had an atomically flat interface. The diamond film other than the mesa structure was selectively etched until the low-resistance diamond film formed first appeared, an electrode with a low contact resistance was formed on the low-resistance diamond film and the n-type diamond surface on the mesa structure, thereby forming a pn-junction semiconductor device. An exemplary diagram of the cross-sectional structure is shown in FIG. 6.

Figure 7:
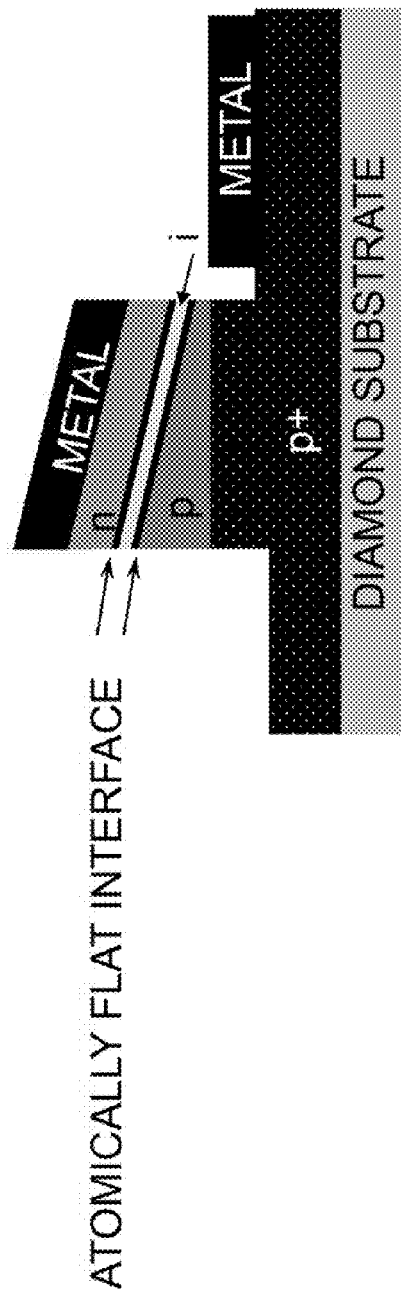
FIG. 7 shows an example of a semiconductor device using a diamond substrate acquired by the method of the present invention.

A pn-junction semiconductor device in which a high-quality i layer having few impurity is provided at the pn junction interface can also be prepared. An exemplary diagram of the cross-sectional structure is shown in FIG. 7.

In the semiconductor device, an n$^+$ layer (phosphorus concentration of $10^{19}$ to $10^{22}$ atoms/cm$^3$ in the film) may be provided at the metal-n-type diamond film interface to reduce the contact resistance.

INDUSTRIAL APPLICABILITY

According to the present invention, not only selective formation of an atomically flat plane on a diamond surface but also step control and doping control on the nano level, such as delta doping, can be expected.

The invention claimed is:

1. A method of selectively forming an atomically flat plane on a diamond surface comprising growing diamond on a stepped diamond mesa surface of crystal structure (110) or (111) by CVD (Chemical Vapor Deposition) under growth conditions such that step-flow growth of diamond is carried out thereafter.

2. The method of selectively forming an atomically flat plane on a diamond surface according to claim 1, wherein a metal is disposed on the stepped mesa surface of a diamond substrate of (110) or (111), or diamond film homoepitaxially grown by CVD, patterning the metal in an intended pattern, and etching the diamond to form the stepped mesa surface, and then removing the metal.

3. The method of selectively forming an atomically flat plane on a diamond surface according to claim 1, wherein CVD is microwave plasma CVD.

4. The method of selectively forming an atomically flat plane on a diamond surface according to claim 1, wherein in the step-flow growth, a feed amount of a carbon source gas is 0.001% to 0.2%.

* * * * *